(12) United States Patent
Majima

(10) Patent No.: US 11,569,810 B2
(45) Date of Patent: Jan. 31, 2023

(54) CURRENT DETECTION CIRCUIT

(71) Applicants: Kabushiki Kaisha Toshiba, Tokyo (JP); Toshiba Electronic Devices & Storage Corporation, Tokyo (JP)

(72) Inventor: Hideaki Majima, Minato Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/344,727

(22) Filed: Jun. 10, 2021

(65) Prior Publication Data

US 2021/0305977 A1   Sep. 30, 2021

Related U.S. Application Data

(63) Continuation of application No. 16/815,498, filed on Mar. 11, 2020, now Pat. No. 11,063,582.

(30) Foreign Application Priority Data

Aug. 27, 2019  (JP) .............................. JP2019-154471

(51) Int. Cl.
| | |
|---|---|
| *H03K 17/08* | (2006.01) |
| *G01R 19/00* | (2006.01) |
| *H03F 3/45* | (2006.01) |
| *H03K 17/687* | (2006.01) |
| *G05F 1/573* | (2006.01) |

(52) U.S. Cl.
CPC ......... *H03K 17/08* (2013.01); *G01R 19/0092* (2013.01); *G05F 1/573* (2013.01); *H03F 3/45179* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 5,175,489 | A | * | 12/1992 | Mizuide .................... G05F 3/22 323/315 |
| 5,467,219 | A |  | 11/1995 | Ushirozawa |
| 5,646,520 | A | * | 7/1997 | Frank ................. H03K 17/0822 324/762.01 |
| 5,861,736 | A |  | 1/1999 | Corsi et al. |
| 6,700,360 | B2 |  | 3/2004 | Biagi et al. |

(Continued)

FOREIGN PATENT DOCUMENTS

| | | |
|---|---|---|
| JP | H06-301073 A | 10/1994 |
| JP | 2005295360 A | 10/2005 |

(Continued)

*Primary Examiner* — Thomas J. Hiltunen
*Assistant Examiner* — Khareem E Almo
(74) *Attorney, Agent, or Firm* — Allen & Overy LLP

(57) ABSTRACT

A current detection circuit includes normally-on-type and a first normally-off-type switching elements with main current paths that are connected in series, and a second normally-off-type switching element that has a source and a gate that are connected to a source and a gate of the first normally-off-type switching element and a drain that is connected to a constant current source, and executes a division process by using drain voltages of the two normally-off-type switching elements.

20 Claims, 5 Drawing Sheets

(56) References Cited

U.S. PATENT DOCUMENTS

| | | | |
|---|---|---|---|
| 7,199,566 B2 | 4/2007 | Suzuki | |
| 7,535,305 B1* | 5/2009 | Li | H03F 3/45192 |
| | | | 330/267 |
| 7,960,997 B2 | 6/2011 | Williams | |
| 8,368,363 B2 | 2/2013 | Nishida | |
| 8,410,821 B2 | 4/2013 | Ohara et al. | |
| 8,810,219 B2 | 8/2014 | Suzuki | |
| 9,223,329 B2 | 12/2015 | Pulvirenti et al. | |
| 9,312,723 B2 | 4/2016 | Nagata et al. | |
| 9,804,205 B2* | 10/2017 | Duvjnak | G01R 19/10 |
| 9,831,807 B2 | 11/2017 | Kitamoto | |
| 9,954,461 B1 | 4/2018 | Duvnjak | |
| 10,209,277 B2 | 2/2019 | Okuyama et al. | |
| 10,218,286 B2 | 2/2019 | Duvnjak | |
| 10,581,448 B1* | 3/2020 | Far | H03M 7/16 |
| 10,637,368 B2 | 4/2020 | Duvnjak | |
| 10,819,283 B1* | 10/2020 | Far | H03M 1/745 |
| 10,924,028 B2 | 2/2021 | Duvnjak | |
| 11,063,582 B2* | 7/2021 | Majima | G05F 1/573 |
| 11,275,909 B1* | 3/2022 | Far | H03F 3/45273 |
| 2003/0076084 A1 | 4/2003 | Elbanhawy | |
| 2005/0248976 A1* | 11/2005 | Huang | G11C 29/50 |
| | | | 365/149 |
| 2008/0224675 A1 | 9/2008 | Takagi | |
| 2008/0290941 A1* | 11/2008 | Ludwig | H03F 3/45076 |
| | | | 330/253 |
| 2008/0310236 A1* | 12/2008 | Baker | G11C 8/08 |
| | | | 365/158 |
| 2009/0163784 A1* | 6/2009 | Sarpeshkar | H03F 1/342 |
| | | | 330/98 |
| 2010/0052636 A1 | 3/2010 | Takagi et al. | |
| 2010/0220049 A1 | 9/2010 | Murakami | |
| 2010/0225384 A1 | 9/2010 | Hirose et al. | |
| 2011/0234311 A1* | 9/2011 | Hirashiki | G01R 19/0092 |
| | | | 327/581 |
| 2012/0187927 A1 | 7/2012 | Yu et al. | |
| 2013/0181752 A1 | 7/2013 | Chen et al. | |
| 2014/0184182 A1 | 7/2014 | Yajima et al. | |
| 2014/0354249 A1 | 12/2014 | Kurozo et al. | |
| 2014/0354350 A1 | 12/2014 | Bowers et al. | |
| 2016/0322900 A1* | 11/2016 | Xu | H02M 3/1588 |
| 2017/0033783 A1 | 2/2017 | Rahman et al. | |
| 2017/0205842 A1 | 7/2017 | Isobe | |
| 2018/0358904 A1 | 12/2018 | Duvnjak | |
| 2019/0050011 A1 | 2/2019 | Fujimoto et al. | |
| 2019/0052239 A1 | 2/2019 | Iwamoto | |
| 2019/0149062 A1 | 5/2019 | Duvnjak | |
| 2019/0190252 A1* | 6/2019 | Hanagami | H03K 17/08122 |
| 2019/0242929 A1* | 8/2019 | Yoshino | H02P 29/00 |
| 2019/0334437 A1 | 10/2019 | Murakami | |
| 2019/0334491 A1* | 10/2019 | Schober | H03K 19/00384 |
| 2020/0052586 A1 | 2/2020 | Price et al. | |
| 2020/0064381 A1 | 2/2020 | Komatsu | |
| 2020/0220476 A1 | 7/2020 | Duvnjak | |
| 2021/0211065 A1 | 7/2021 | Duvnjak | |

FOREIGN PATENT DOCUMENTS

| | | |
|---|---|---|
| JP | 5169498 B2 | 3/2013 |
| JP | 5691158 B2 | 4/2015 |
| JP | 2016-201693 A | 12/2016 |
| JP | 2019-004686 A | 1/2019 |
| WO | 2015166523 A1 | 11/2015 |

* cited by examiner

CURRENT DETECTION CIRCUIT

CROSS-REFERENCE TO RELATED APPLICATIONS

This application is a continuation of U.S. application Ser. No. 16/815,498, filed Mar. 11, 2020, which is based upon and claims the benefit of priority from Japanese Patent Application No. 2019-154471, filed on Aug. 27, 2019; the entire contents of which are incorporated herein by reference.

FIELD

The present embodiment generally relates to a current detection circuit.

BACKGROUND

A semiconductor device where a normally-on-type switching element and a normally-off-type switching element are cascode-connected has been disclosed conventionally. For example, a normally-on-type switching element is composed of a transistor where gallium nitride (GaN) or silicon carbide (SiC) is provided as a material thereof. A semiconductor device with a high voltage resistance and a low loss is provided by using a normally-on-type switching element that is composed of GaN or SiC. On the other hand, a normally-on-type switching element is included therein, so that, for example, it may be impossible to detect an output current of a semiconductor device accurately in response to a leakage current of the normally-on-type switching element. Furthermore, a manufacturing variation is caused in a characteristic such as an on-resistance of a switching element. A current detection circuit with high reliability is desired that utilizes a characteristic of a semiconductor device that includes a normally-on-type switching element and is capable of mitigating an influence that is caused by a manufacturing variation and thereby detecting an output current accurately.

DETAILED DESCRIPTION

According to one embodiment, a current detection circuit includes a normally-on-type first switching element that has a source, a drain, and a gate, a normally-off-type second switching element that has a source, a drain, and a gate and has a main current path that is connected to a main current path of the first switching element in series, a normally-off-type third switching element that has a source that is connected to the source of the second switching element, a gate, and a drain that is connected to a constant current source, where a voltage that is applied to the gate of the second switching element at a time of current detection is applied to the gate of the third switching element, and a division circuit that executes a division process by using a drain voltage of the second switching element and a drain voltage of the third switching element.

Hereinafter, a current detection circuit according to any of embodiments will be explained in detail with reference to the accompanying drawings. Additionally, the present invention is not limited by such an embodiments.

First Embodiment

Figure 1:
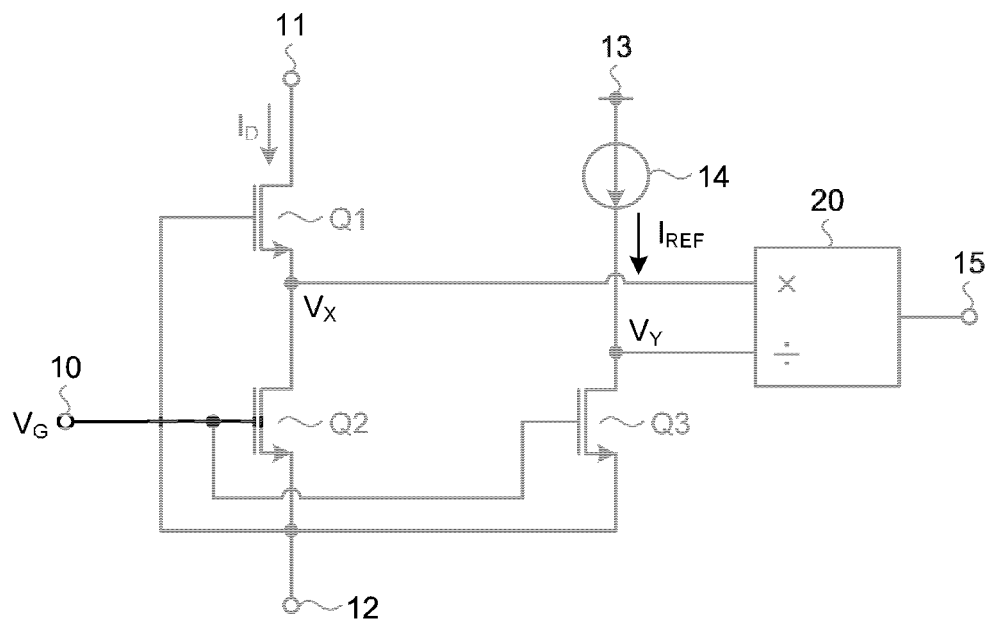
FIG. 1 is a diagram illustrating a current detection circuit according to a first embodiment.

FIG. 1 is a diagram illustrating a current detection circuit according to a first embodiment. A current detection circuit according to the present embodiment has a normally-on-type switching element Q1. The switching element Q1 is composed of, for example, an N-channel-type MOS transistor where GaN is provided as a material thereof. In a MOS transistor where GaN is provided as a material thereof, for example, a main current path between a drain and a source thereof is composed of GaN. Hereinafter, it may be referred to as a GaN transistor.

A current detection circuit has normally-off-type switching elements Q2, Q3. The normally-off-type switching elements Q2, Q3 are composed of, for example, an N-channel-type MOS transistors where Si is provided as a material thereof. In a MOS transistor where Si is provided as a material thereof, for example, a main current path between a drain and a source thereof is composed of Si. Hereinafter, it may be referred to as a Si transistor.

A drain of the switching element Q1 is connected to a terminal 11. The terminal 11 is connected to, for example, a (non-illustrated) power source line where a voltage of 600V is applied thereto, via a (non-illustrated) load. A source of the switching element Q1 is connected to a drain of the switching element Q2. A gate of the switching element Q1 is connected to a source of the switching element Q2.

The source of the switching element Q2 is connected to a terminal 12. That is, a drain-source path that is a main current path of the switching element Q2 is connected to a drain-source path that is a main current path of the switching element Q1, in series. The terminal 12 is supplied with, for example, a potential of ground GND. A gate of the switching element Q2 is connected to a terminal 10. Current detection is executed, for example, in a state where a driving signal $V_G$ is applied to the terminal 10.

A source of the switching element Q3 is connected to the source of the switching element Q2 and a drain thereof is connected to a constant current source 14 that supplies a constant current $I_{REF}$ thereto. The constant current source 14 is configured by using, for example, a (non-illustrated) bandgap reference circuit. Another terminal of the constant current source 14 is connected to a power source line 13. A gate of the switching element Q3 is connected to the gate of the switching element Q2. A drain of the switching element Q2 is connected to a first input terminal (x) of a division circuit 20. A drain of the switching element Q3 is connected to a second input terminal (÷) of the division circuit 20.

The switching elements Q2 and Q3 are formed on a (non-illustrated) common semiconductor substrate. They are formed on a common semiconductor substrate, so that it is possible to match element characteristics of both of them. Even if a manufacturing variation is caused, element characteristics of the switching elements Q2 and Q3 vary similarly. For example, in a case where an on-resistance of the switching element Q2 varies so as to increase, an on-resistance of the switching element Q3 also varies so as to increase similarly.

Dimensions of the switching elements Q2 and Q3 are set in such a manner that gate lengths thereof are identical and gate widths thereof are at a dimension ratio of n:m. According to a dimension ratio, a ratio of an on-resistance Ron2 of the switching element Q2 to an on-resistance Ron3 of the switching element Q3 is represented by formula (1).

$$Ron2: Ron3 = 1/n : 1/m \tag{1}$$

Drain voltages $V_X$, $V_Y$ of the switching elements Q2 and Q3 are represented by formulas (2), (3). Drain voltages $V_X$, $V_Y$ in a case where a potential of ground GND that is applied to the terminal 12, zero (0) V is provided as a reference are represented thereby. Hereinafter, the same applies.

$$V_X = Ron2 \cdot I_D \tag{2}$$

$$V_Y = Ron3 \cdot I_{REF} \tag{3}$$

Herein, $I_D$ represents a drain current $I_D$ that flows through the switching element Q1. A current that flows through the switching element Q2 is substantially equal to a current that flows though the switching element Q1, so that a current that flows through the switching element Q2 is a current that is substantially equal to an output current $I_D$. Hereinafter, a drain current $I_D$ of the switching element Q1 may conveniently be used as an output current $I_D$.

An output γ that is obtained from an output terminal 15 of the division circuit 20 is represented by formula (4).

$$\gamma = \frac{V_X}{V_Y} \tag{4}$$
$$= \frac{Ron2 \cdot I_D}{Ron3 \cdot I_{REF}}$$
$$= \frac{m}{n} \cdot \frac{I_D}{I_{REF}}$$

An output γ as provided in formula (4) represents how many times as much as a value of a constant current $I_{REF}$ an output current $I_D$ is, as a ratio of current densities. For example, in a case where a dimension ratio n:m of gate widths of the switching elements Q2 and Q3 is set at 10000:1, an output γ is "1" when an output current $I_D$ is 10000 times as much as a constant current $I_{REF}$. It is possible to detect an output current $I_D$ precisely, by a value of an output γ.

Furthermore, according to setting of a value of a maximum current $I_{MAX}$ of an output current $I_D$ that is allowable, a value of a constant current $I_{REF}$, and a dimension ratio n:m of the switching elements Q2, Q3, it is possible to provide, for example, a configuration to detect that an output current $I_D$ is provided in a state of an excessive current that is greater than a maximum current $I_{MAX}$ in a case where an output γ is greater than "1".

For example, in a case where gate lengths of the switching elements Q2 and Q3 are identical, a ratio of gate widths thereof is 10000:1, and a constant current $I_{REF}$ is 1 mA, it is indicated that an output current $I_D$ is 10 A when an output γ is "1". Therefore, if a maximum current $I_{MAX}$ that is allowable as an output current $I_D$ is 10 A, it is indicated that a current that is greater than a maximum current $I_{MAX}$ that is allowable flows as an output current $I_D$ in a case where an output γ is greater than "1".

Additionally, it is possible to detect an output current $I_D$ with a value that is greater than that of a constant current $I_{REF}$ by increasing a ratio N(=n/m) of gate widths of the switching elements Q2 and Q3 (where N is any positive number that is greater than 1). That is, it is possible to detect an output current $I_D$ that is a high current by a constant current $I_{REF}$ with a low value by increasing a ratio N, so that it is possible to reduce a constant current $I_{REF}$ of the constant current source 14 and thereby attain low power consumption. For example, a value of a constant current $I_{REF}$ is set at a value 1/N times as much as a maximum current $I_{MAX}$ that is allowable as an output current $I_D$.

Formula (4) is represented by a dimension ratio of the switching elements Q2 and Q3 and does not include a term of an on-resistance Ron2, Ron3. That is, a configuration to divide a drain voltage $V_X$ by a drain voltage $V_Y$ is provided, so that an output γ is represented not by values of on-resistances Ron2, Ron3 but by a ratio of both resistances. As already described, in a case where the switching elements Q2 and Q3 are formed on a common semiconductor substrate, on-resistances Ron2, Ron3 of the switching elements Q2 and Q3 tend to vary similarly. Therefore, variations of on-resistances Ron2, Ron3 that are caused by manufacturing variations are canceled, so that a ratio of the on-resistances Ron2, Ron3 does not vary and an output γ is stabilized. Hence, it is possible to detect an output current $I_D$ precisely and accurately by an output γ.

The present embodiment includes the division circuit 20 that executes division by using a drain voltage $V_X$ of the switching element Q2 and a drain voltage $V_Y$ of the switching element Q3, so that it is possible to detect an output current $I_D$ that flows through the normally-on-type switching element Q1, precisely and accurately, by an output γ that is obtained by the division.

Figure 2:
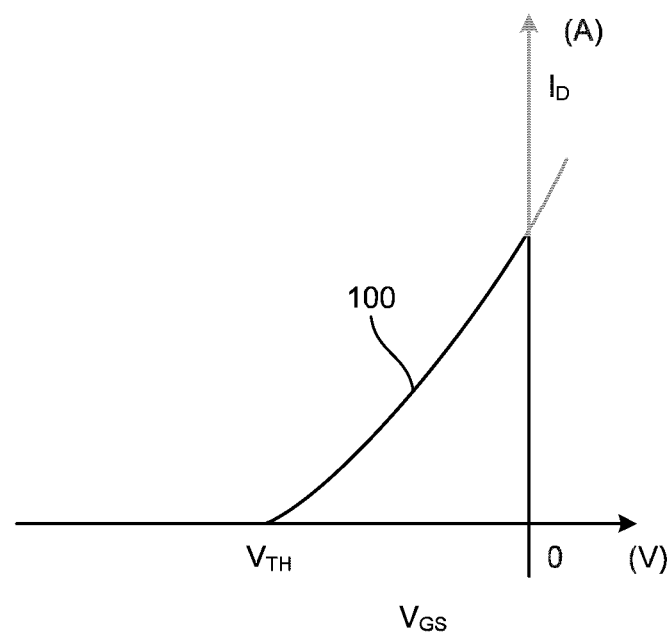
FIG. 2 is a diagram illustrating a characteristic of a normally-on-type switching element.

FIG. 2 is a diagram illustrating a characteristic of a normally-on-type switching element. That is, a characteristic of the switching element Q1 according to the first embodiment as already described is illustrated therein. A horizontal axis represents a gate-source voltage $V_{GS}$ and a vertical axis represents a drain current $I_D$. A characteristic curve 100 is illustrated where a drain current $I_D$ flows even when a gate-source voltage $V_{GS}$ is zero (0) V and the drain current $I_D$ is approximately zero (0) A when the gate-source voltage $V_{GS}$ is a threshold voltage $V_{TH}$ that is minus.

Figure 3:
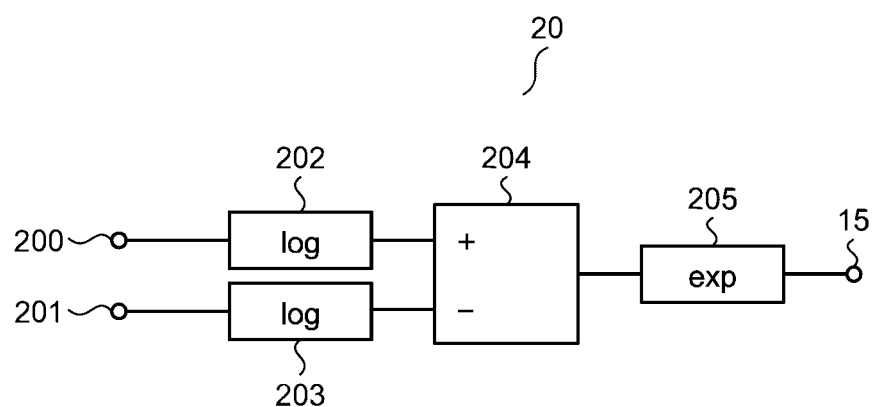
FIG. 3 is a diagram illustrating one configuration example of a division circuit.

FIG. 3 is a diagram illustrating one configuration example of the division circuit 20. The present configuration example has logarithmic conversion circuits 202, 203. One terminal of the logarithmic conversion circuit 202 is connected to an input terminal 200 and another terminal thereof is connected to one input end (+) of a subtraction circuit 204. The logarithmic conversion circuit 202 logarithmically converts an input voltage supplied to the input terminal 200 and outputs an output voltage. The input terminal 200 corresponds to an input end (x) of the division circuit 20 as already described.

One terminal of the logarithmic conversion circuit 203 is connected to an input terminal 201 and another terminal thereof is connected to another input end (−) of the subtraction circuit 204. The logarithmic conversion circuit 203 logarithmically converts an input voltage supplied to the input end terminal 201 and outputs an output voltage. The input end terminal 201 corresponds to an input end (÷) of the division circuit 20 as already described.

The subtraction circuit 204 subtracts an output voltage of the logarithmic conversion circuit 203 from an output voltage of the logarithmic conversion circuit 202 and outputs a differential signal. Output voltages that have been logarithmically converted by the logarithmic conversion circuits 202, 203 are subtracted by the subtraction circuit 204, so that a signal provided by logarithmically converting a value provided by dividing an input voltage to the input terminal 200 by an input voltage to the input terminal 201 is output from the subtraction circuit 204.

An output signal of the division circuit 204 is supplied to an anti-logarithmic conversion circuit 205. An output signal of the division circuit 204 is anti-logarithmically converted by the anti-logarithmic conversion circuit 205, so that a signal provided by dividing an input voltage that is supplied to the input terminal 200 by an input voltage that is supplied to the input terminal 201 is output from the output terminal 15. That is, the division circuit 20 is composed of a configuration that includes the logarithmic conversion circuits 202, 203, the subtraction circuit 204, and the anti-logarithmic conversion circuit 205.

Figure 4:
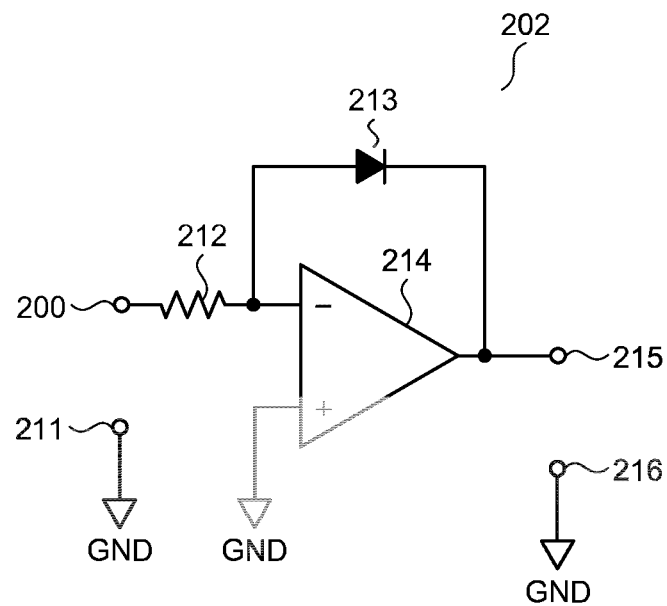
FIG. 4 is a diagram illustrating one configuration example of a logarithmic conversion circuit.

FIG. 4 is a diagram illustrating one configuration example of the logarithmic conversion circuit 202. The logarithmic conversion circuit 203 also has a similar configuration. The present configuration example has input terminals 200, 211. The input terminal 211 is grounded GND. The input terminal 200 corresponds to the input terminal 200 in FIG. 3. An input voltage that is a conversion target is applied between the input terminal 200 and the input terminal 211.

The present configuration example has a differential amplification circuit 214. It has a resistor 212 that is connected between an inverting input end (−) of the differential amplification circuit 214 and the input terminal 200. It has a diode 213 that is connected in a forward direction from an inverting input end (−) of the differential amplification circuit 214 toward a side of an output terminal 215. A non-inverting input end (+) of the differential amplification circuit 214 is grounded GND. An input voltage that is applied between the input terminals 200 and 211 is logarithmically converted by a current-voltage characteristic of the diode 213, that is, a current-voltage characteristic where a relationship between an input current and an output voltage is a logarithmic relationship, and a voltage that has been logarithmically converted is output between the output terminal 215 and an output terminal 216 that is grounded GND. The logarithmic conversion circuit 203 also has a similar configuration.

Figure 5:
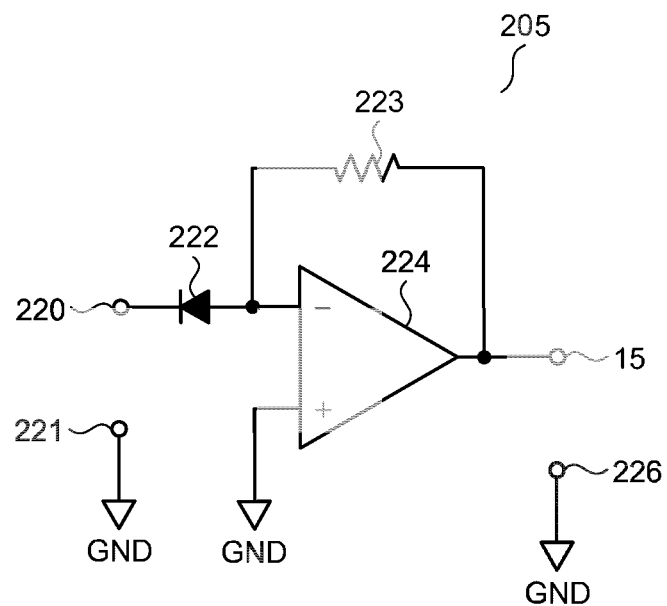
FIG. 5 is a diagram illustrating one configuration example of an anti-logarithmic conversion circuit.

FIG. 5 is a diagram illustrating one configuration example of the anti-logarithmic conversion circuit 205. The present configuration example has input terminals 220, 221. The input terminal 221 is grounded GND. For example, an output voltage of the subtraction circuit 204 is applied between the input terminals 220 and 221.

The present configuration example has a differential amplification circuit 224. A diode 222 is connected in a forward direction between an inverting input end (−) of the differential amplification circuit 224 and the input terminal 220. A resistor 223 is connected between an inverting input end (−) of the differential amplification circuit 224 and an output terminal 15. A non-inverting input end (+) of the differential amplification circuit 224 is grounded GND. An input voltage that is applied between the input terminals 220 and 221 is anti-logarithmically converted by a voltage-current characteristic of the diode 222, that is, a voltage-current characteristic where an input voltage and an output current are provided in an exponential relationship, and a voltage that has been anti-logarithmically converted is output between the output terminal 15 and an output terminal 226 that is grounded GND. Therefore, it is possible to configure the division circuit 20 by an analog circuit that is composed of the diodes 213, 222, the differential amplification circuits 214, 224, and the like. A configuration is provided by an analog circuit, so that a processing speed is a high speed.

Figure 6:
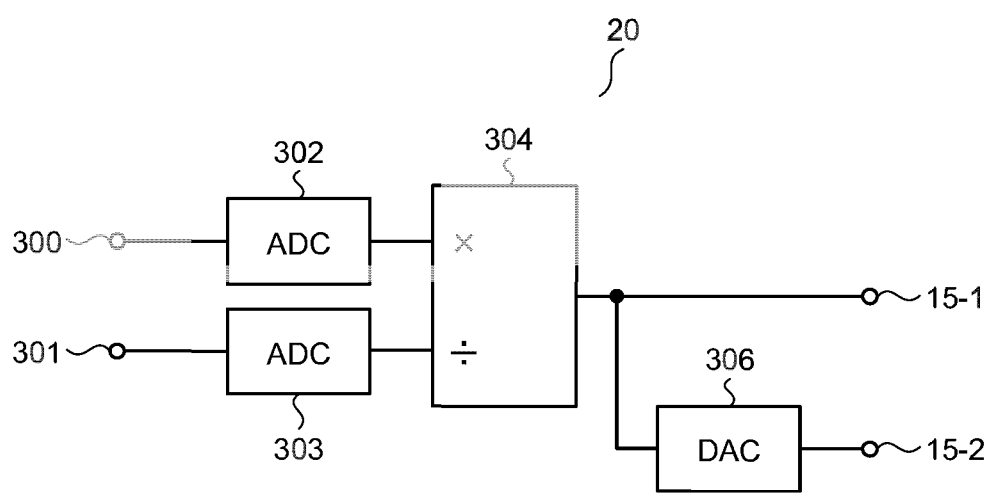
FIG. 6 is a diagram illustrating another configuration example of a division circuit.

FIG. 6 is a diagram illustrating another configuration example of the division circuit 20. The present configuration example has input terminals 300, 301. For example, the input terminal 300 is supplied with a drain voltage $V_X$ and the input terminal 301 is supplied with a drain voltage $V_Y$. It has an AD converter 302 that is connected to the input terminal 300. The AD converter 302 converts an input voltage that is supplied to the input terminal 300 into a digital value and supplies it to an input end (x) of an operational circuit 304.

The present configuration example has an AD converter 303 that is connected to the input terminal 301. The AD converter 303 converts an input voltage that is supplied to the input terminal 301 into a digital value and supplies it to an input end (÷) of the operational circuit 304.

The operational circuit 304 executes an operational process to divide a digital value from the AD converter 302 by using a digital value from the AD converter 303 and executes an output. For the operational circuit 304, for example, a Central Processing Unit (CPU) is used. A digital signal is output from an output terminal 15-1 and an analog signal that has been analog-converted by a DA converter 306 is output from an output terminal 15-2. It is possible to detect how many times as much as a current that is set by a constant current $I_{REF}$ and a dimension ratio n:m of the switching elements Q2 and Q3 a current that flows as an output current $I_D$ is, by a digital value of an output γ that is output from the output terminal 15-1.

In the present configuration example, the division circuit 20 is configured in such a manner that drain voltages $V_X$, $V_Y$ are digitally converted by the AD converters 302, 303 and an operational process of division is executed by the operational circuit 304 to execute an output. Furthermore, an output signal of the operational circuit 304 is analog-converted by the DA converter 306, so that it is possible to configure the division circuit 20 that obtains an analog output simultaneously. A digital process that uses the AD converts 302, 303 is executed, so that an influence of noise or the like is reduced.

Second Embodiment

Figure 7:
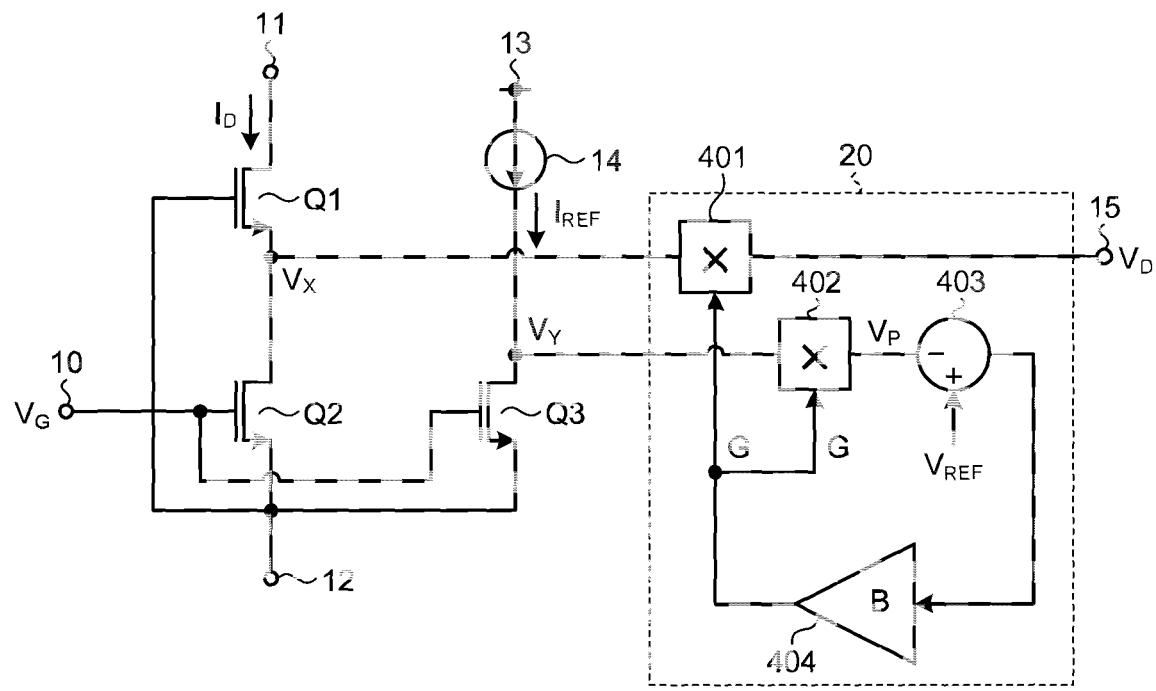
FIG. 7 is a diagram illustrating a current detection circuit according to a second embodiment.

FIG. 7 is a diagram illustrating a current detection circuit according to a second embodiment. A component that corresponds to that of an embodiment as already described will be provided with an identical sign and a duplicative descriptions will be provided only in a needed case. Hereinafter, the same applies.

A division circuit 20 in the present embodiment has a multiplication circuit 401 where a drain voltage $V_X$ is supplied thereto and a multiplication circuit 402 where a drain voltage $V_Y$ is supplied thereto. An output voltage $V_P$ of the multiplication circuit 402 is supplied to a subtraction circuit 403. The subtraction circuit 403 executes subtraction of an output voltage $V_P$ of the multiplication circuit 402 from a reference voltage $V_{REF}$ and supplies it to an amplification circuit 404. A reference voltage $V_{REF}$ is generated by using, for example, a (non-illustrated) bandgap reference circuit.

An output G of the amplification circuit 404 is supplied to the multiplication circuits 401, 402. The multiplication circuit 401 executes a process to multiply a drain voltage $V_X$ by an output G of the amplification circuit 404 and supplies an output voltage $V_D$ that is obtained by such a multiplication process to the output terminal 15. The multiplication circuit 402 executes a multiplication process between a drain voltage $V_Y$ and an output G of the amplification circuit 404 and supplies an output voltage $V_P$ that is obtained by the multiplication process to the subtraction circuit 403.

Switching elements Q2 and Q3 in the present embodiment are formed on a (non-illustrated) common semiconductor substrate. Dimensions of the switching elements Q2 and Q3 are set in such a manner that gate lengths thereof are identical and a ratio of gate widths thereof is n:m. According to a dimension ratio of gate widths thereof, a ratio of on-resistances Ron2 and Ron3 of the switching elements Q2 and Q3 is represented by formula (5).

$$Ron2 : Ron3 = 1/n : 1/m \tag{5}$$

Drain voltages $V_x$, $V_Y$ of the switching elements Q2 and Q3 are represented by formulas (6), (7).

$$V_X = Ron2 \cdot I_D \tag{6}$$

$$V_Y = Ron3 \cdot I_{REF} \tag{7}$$

A drain voltage $V_X$ is multiplied by an output G from the amplification circuit 404 by the multiplication circuit 401. An output voltage $V_D$ of the multiplication circuit 401 is represented by formula (8).

$$V_D = V_X \cdot G \tag{8}$$

A drain voltage $V_Y$ is multiplied by an output G from the amplification circuit 404 by the multiplication circuit 402, so that an output voltage $V_P$ is obtained from the multiplication circuit 402. An output G from the amplification circuit 404 is represented by $V_P/V_Y$ from a relationship between an output voltage $V_P$ of the multiplication circuit 402 and a drain voltage $V_Y$. The subtraction circuit 403 executes subtraction between an output voltage $V_P$ and a reference voltage $V_{REF}$ and supplies an output voltage that is obtained by such subtraction to the amplification circuit 404.

Due to a feedback loop from the subtraction circuit 403 through the amplification circuit 404 and the multiplication circuit 402 to the subtraction circuit 403, an output voltage $V_P$ of the multiplication circuit 402 is equal to a reference voltage $V_{REF}$ in a case where a gain B of the amplification circuit 404 is sufficiently high. Therefore, as an output G (=$V_{REF}/V_Y$) is substituted into formula (8), formula (9) is obtained.

$$V_D = (V_X / V_Y) \cdot V_{REF} \tag{9}$$

Moreover, as formulas (6), (7) are substituted into formula (9), formula (10) is obtained.

$$V_D = (Ron2 \cdot I_D \cdot V_{REF}) / (Ron3 \cdot I_{REF}) \tag{10}$$

Moreover, as formula (5) is substituted into formula (10) and arrangement thereof is executed, formula (11) is obtained.

$$\begin{aligned} V_D &= \frac{m}{n} \cdot \frac{I_D}{I_{REF}} \cdot V_{REF} \\ &= \gamma \cdot V_{REF} \end{aligned} \tag{11}$$

An output $\gamma$ in formula (11) represents a ratio of an output current $I_D$ to a constant current $I_{REF}$. A reference voltage $V_{REF}$ is, for example, a fixed voltage that is set by a bandgap reference circuit, so that it is possible to detect how many times as much as a constant current $I_{REF}$ a current that flows as an output current $I_D$ is, by detecting an output voltage $V_D$.

The present embodiment includes the division circuit 20 that divides a drain voltage $V_X$ by a drain voltage $V_Y$ as indicated in formula (9). Hence, formula (11) that represents an output voltage $V_D$ includes a dimension ratio of the switching elements Q2 and Q3 but does not include a term of an on-resistance Ron2, Ron3. Thereby, an influence of variations of on-resistances Ron2, Ron3 that are caused by manufacturing variations thereof is mitigated. An output voltage $V_D$ that is changed depending on an output $\gamma$ that represents a ratio of on-resistances Ron2 and Ron3 and a ratio of an output current $I_D$ to a constant current $I_{REF}$ is detected, so that it is possible to detect an output current $I_D$ precisely and accurately.

A drain voltage $V_Y$ is determined by an on-resistance Ron3 of the switching element Q3 and a constant current $I_{REF}$ as indicated in formula (7). Furthermore, a value of an output G from values of a reference voltage $V_{REF}$ and a drain voltage $V_Y$, and further, a gain B of the amplification circuit 404 that is needed depending on a precision that is needed for the division circuit 20 are obtained. Circuit constants of the multiplication circuits 401, 402, the subtraction circuit 403, and the amplification circuit 404 with a fixed gain are set by using each obtained factor, so that it is possible to configure the division circuit 20 that divides a drain voltage $V_X$ by a drain voltage $V_Y$.

Third Embodiment

Figure 8:
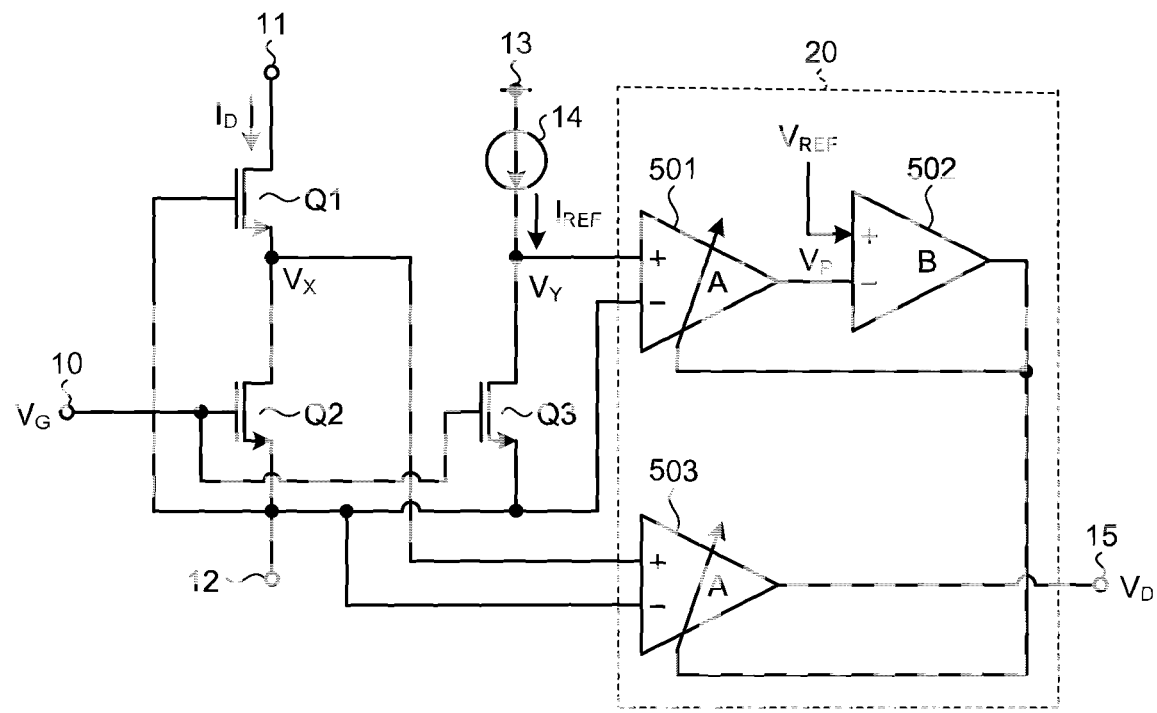
FIG. 8 is a diagram illustrating a current detection circuit according to a third embodiment.

FIG. 8 is a diagram illustrating a current detection circuit according to a third embodiment. The present embodiment has a variable gain amplification circuit 503 where a drain voltage $V_X$ of the switching element Q2 is supplied to a non-inverting input end (+) thereof and a potential of a source thereof is applied to an inverting input end (−) thereof. An output of the variable gain amplification circuit 503 is supplied to the output terminal 15.

The present embodiment has a variable gain amplification circuit 501 where a drain voltage $V_Y$ of the switching element Q3 is supplied to a non-inverting input end (+) thereof and a potential of a source thereof is applied to an inverting input end (−) thereof. An output of the variable gain amplification circuit 501 is supplied to an inverting input end (−) of a differential amplification circuit 502. A reference voltage $V_{REF}$ is supplied to a non-inverting input end (+) of the differential amplification circuit 502. The differential amplification circuit 502 amplifies a difference between a reference voltage $V_{REF}$ and an output voltage $V_P$ of the variable gain amplification circuit 501 and supplies an output signal to the variable gain amplification circuits 501, 503 as a gain control signal. For example, bias currents of the variable gain amplification circuits 501, 503 are controlled by the output signal of the differential amplification circuit 502, so that gains A of the variable gain amplification circuits 501, 503 are controlled.

The switching elements Q2 and Q3 in the present embodiment are formed on a (non-illustrated) common semiconductor substrate. For example, dimensions of the switching elements Q2 and Q3 are set in such a manner that gate lengths thereof are identical and gate widths thereof are at a ratio of n:m. Setting at such a ratio is executed, so that a ratio of on-resistances Ron2 and Ron3 of the switching elements Q2 and Q3 is represented by formula (12).

$$Ron2 : Ron3 = 1/n : 1/m \quad (12)$$

Drain voltages $V_X$, $V_Y$ of the switching elements Q2 and Q3 are represented by formulas (13), (14).

$$V_X = Ron2 \cdot I_D \quad (13)$$

$$V_Y = Ron3 \cdot I_{REF} \quad (14)$$

An output voltage $V_D$ of the variable gain amplification circuit 501 is represented by formula (15).

$$V_P = V_Y \cdot A \quad (15)$$

Herein, A represents a gain of the variable gain amplification circuit 501.

An output voltage $V_D$ of the variable gain amplification circuit 503 is represented by formula (16).

$$V_D = A \cdot Ron2 \cdot I_D \quad (16)$$

A difference between an output voltage $V_P$ of the variable gain amplification circuit 501 and a reference voltage $V_{REF}$ is amplified by the differential amplification circuit 502 and output. As it is assumed that gains A of the variable gain amplification circuits 501, 503 and a gain B of the differential amplification circuit 502 are sufficiently high, gains A of the variable gain amplification circuits 501, 503 are controlled by an output of the differential amplification circuit 502 in such a manner that an output voltage $V_P$ of the variable gain amplification circuit 501 is equal to a reference voltage $V_{REF}$ by a feedback loop that has the differential amplification circuit 502 and the variable gain amplification circuit 501. Hence, from a relationship as indicated in formula (15), a gain A is represented by $V_{REF}/V_Y$. As such a relationship is substituted into formula (16), formula (17) is obtained.

$$V_D = (V_X/V_Y) \cdot V_{REF} \quad (17)$$

As formulas (13), (14) are substituted into formula (17), formula (18) is obtained.

$$V_D = (Ron2 \cdot I_D \cdot V_{REF}) / (Ron3 \cdot I_{REF}) \quad (18)$$

As formula (12) is substituted into formula (18) and arrangement thereof is executed, formula (19) is obtained.

$$V_D = \frac{m}{n} \cdot \frac{I_D}{I_{REF}} \cdot V_{REF} \quad (19)$$

$$= \gamma \cdot V_{REF}$$

An output γ in formula (19) represents a ratio of an output current $I_D$ to a constant current $I_{REF}$. A reference voltage $V_{REF}$ is a fixed voltage, so that it is possible to detect an output current $I_D$, by detecting an output voltage $V_D$. Furthermore, formula (19) includes a term of a ratio of on-resistances Ron2, Ron3 but does not include a term of an on-resistance Ron2, Ron3. Therefore, an influence of variations of on-resistances Ron2, Ron3 that are caused by manufacturing variations thereof is mitigated, so that it is possible to detect an output current $I_D$ precisely and accurately, by an output γ.

The present embodiment includes the division circuit 20 that divides a drain voltage $V_X$ by a drain voltage $V_Y$ as indicated in formula (17). Hence, formula (19) that represents an output voltage $V_D$ includes a dimension ratio of the switching elements Q2 and Q3 but does not include a term of an on-resistance Ron2, Ron3. Thereby, an influence of variations of on-resistances Ron2, Ron3 that are caused by manufacturing variations thereof is mitigated. An output voltage $V_D$ that is changed depending on an output γ that represents a ratio of on-resistances Ron2, Ron3 and a ratio of an output current $I_D$ to a constant current $I_{REF}$ is detected, so that it is possible to detect an output current $I_D$ precisely and accurately.

A configuration is provided to control gains of the variable gain amplification circuits 501, 503 by an output signal of the differential amplification circuit 502 that amplifies a difference between a reference voltage $V_{REF}$ and an output voltage $V_P$ of the variable gain amplification circuit 501, so that it is possible to configure the division circuit 20 that divides a drain voltage $V_X$ by a drain voltage $V_Y$.

Fourth Embodiment

Figure 9:
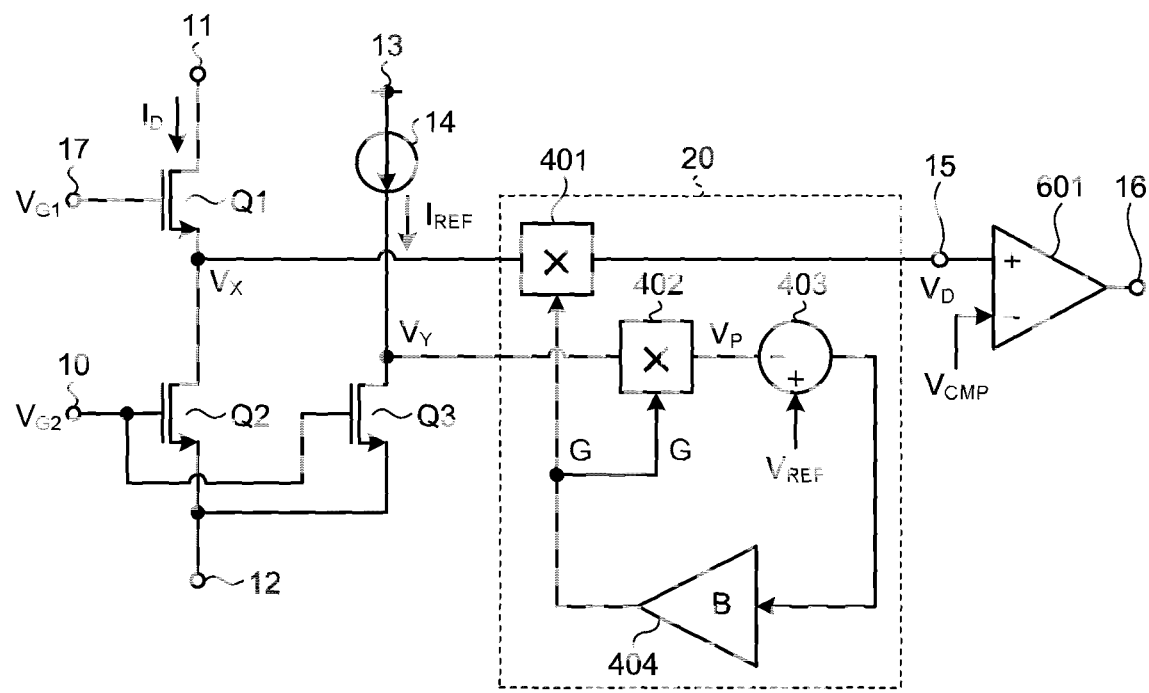
FIG. 9 is a diagram illustrating a current detection circuit according to a fourth embodiment.

FIG. 9 is a diagram illustrating a current detection circuit according to a fourth embodiment. In the present embodiment, a gate of the normally-on-type switching element Q1 is connected to a terminal 17 and a gate of the normally-off-type switching element Q2 is connected to a terminal 10. A driving signal $V_{G2}$ is applied to the terminal 10 and a driving signal $V_{G1}$ is applied to the terminal 17, so that on/off of the switching element Q2 and the switching element Q1 is controlled respectively.

A division circuit 20 in the present embodiment has a configuration that is identical to that of the division circuit 20 in FIG. 7 as already described. The present embodiment has a comparison circuit 601 that compares an output voltage $V_D$ of the output terminal 15 and a reference voltage $V_{CMP}$. A reference voltage $V_{CMP}$ is set by, for example, a value that is determined by an on-resistance Ron2 of the switching element Q2 and a maximum current $I_{MAX}$ that is allowable as an output current $I_D$, that is, $Ron2 \cdot I_{MAX}$.

The comparison circuit 601 outputs a signal at an H-level when an output voltage $V_D$ is greater than the reference voltage $V_{CMP}$ or supplies a signal at an L-level to an output terminal 16 when an output voltage $V_D$ is less than the reference voltage $V_{CMP}$. An output voltage $V_D$ is changed by a ratio of an output current $I_D$ to a constant current $I_{REF}$ as indicated in formula (11) as already described. Therefore, it is indicated that an output current $I_D$ is in an overcurrent state when an output of the comparison circuit 601 is at an H-level. An output signal of the comparison circuit 601 is detected, so that it is possible to detect a state of an output current $I_D$ accurately.

In the present embodiment, on/off of the switching elements Q1, Q2 is controlled by separate driving signals $V_{G1}$, $V_{G2}$. Therefore, a voltage of a driving signal $V_{G1}$ is switched, for example, between a negative voltage that is less than a threshold voltage $V_{TH}$ of the normally-on-type switching element Q1 and a positive voltage to control on/off of the switching element Q1, so that it is possible to suppress a leakage current at a time when the switching element Q1 is turned off. Thereby, it is possible to avoid an erroneous operation of current detection that is caused by a leakage current of the switching element Q1.

Although a gate of the switching element Q3 is connected to a gate of the switching element Q2 in the present embodiment as already described, a configuration may be provided so as to provide a (non-illustrated) power source circuit that supplies a voltage that is set at a value that is identical to a voltage that is applied to a gate of the switching element Q2 and supply the voltage from such a power source circuit to the gate of the switching element Q3 at a time of current detection. That is, a configuration is sufficient to apply a voltage that is equal to the voltage that is applied to the gate of the switching element Q2 at a time of current detection to the gate of the switching element Q3 and thereby turn on the switching element Q3. Gate-source voltages of the switching elements Q2 and Q3 are identical at a time when both of them are turned on, so that it is possible to set a ratio of on-resistances of the switching elements Q2 and Q3 by a dimension ratio n:m of gate widths thereof. Furthermore, dimensions of both gate widths and gate lengths of the switching elements Q2 and Q3 may be different and be set at a predetermined ratio to adjust a ratio of on-resistances Ron2, Ron3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detection circuit, comprising:
   a normally-on-type first switching element that has a source, a drain, and a gate;
   a normally-off-type second switching element that has a source, a drain, and a gate and has a main current path that is connected to a main current path of the first switching element in series;
   a normally-off-type third switching element that has a source that is connected to the source of the second switching element, a gate, and a drain that is connected to a constant current source, where a voltage that is applied to the gate of the second switching element at a time of current detection is applied to the gate of the third switching element; and
   a division circuit including a first terminal connected to the drain of the second switching element and a second terminal connected to the drain of the third switching element, the division circuit being configured to output an output signal determined by a ratio between a drain voltage of the second switching element supplied to the first terminal and a drain voltage of the third switching element supplied to the second terminal.

2. The current detection circuit according to claim 1, wherein the division circuit outputs a signal that is set by a ratio of a drain current of the second switching element and a current value of the constant current source and a dimension ratio of the second and third switching elements.

3. The current detection circuit according to claim 1, wherein the division circuit includes:
   a first logarithmic conversion circuit logarithmically converts the drain voltage of the second switching element to output a first conversion voltage;
   a second logarithmic conversion circuit that logarithmically converts the drain voltage of the third switching element to output a second conversion voltage;
   a subtraction circuit that executes a subtraction process between the first converted voltage of the first logarithmic conversion circuit and the second converted voltage of the second logarithmic conversion circuit to output a differential signal; and
   an anti-logarithmic conversion circuit that anti-logarithmically converts the differential signal of the subtraction circuit.

4. The current detection circuit according to claim 3, wherein the first logarithmic conversion circuit includes:
   first and second input terminals;
   a first differential amplification circuit that has an inverting input end and a non-inverting input end;
   a resistor that is connected between the first input terminal and the inverting input end; and
   a diode that is connected in a forward direction from the inverting input end to a side of an output end of the first differential amplification circuit, and
   the anti-logarithmic conversion circuit includes:
   third and fourth input terminals;
   a second differential amplification circuit that has an inverting input end and a non-inverting input end;
   a diode that is connected in a forward direction from the inverting input end of the second differential amplification circuit to a side of the third input terminal; and
   a resistor that is connected between the inverting input end and an output end of the second differential amplification circuit.

5. The current detection circuit according to claim 1, wherein the division circuit includes:
   a first AD conversion circuit that digitally converts the drain voltage of the second switching element;
   a second AD conversion circuit that digitally converts the drain voltage of the third switching element; and
   an operational circuit that executes a division process by using an output of the first AD conversion circuit and an output of the second AD conversion circuit.

6. The current detection circuit according to claim 5, comprising
   a DA conversion circuit that converts an output of the operational circuit into an analog signal.

7. The current detection circuit according to claim 1, wherein
   the first switching element is composed of a GaN transistor, and
   the second and third switching elements are composed of Si transistors.

8. The current detection circuit according to claim 1, wherein
   the second and third switching elements are formed on a common semiconductor substrate.

9. The current detection circuit according to claim 1, wherein the division circuit includes:
a first multiplication circuit that multiplies the drain voltage of the second switching element by a predetermined factor;
a second multiplication circuit that multiplies the drain voltage of the third switching element by the predetermined factor;
a subtraction circuit that outputs a differential signal between an output of the second multiplication circuit and a predetermined reference voltage; and
an amplification circuit that amplifies the differential signal of the subtraction circuit and supplies the predetermined factor to the first multiplication circuit and the second multiplication circuit.

10. The current detection circuit according to claim 1, wherein the division circuit includes:
a first variable gain amplification circuit that amplifies a voltage between the source and the drain of the second switching element and outputs an output signal;
a second variable gain amplification circuit that amplifies a voltage between the source and the drain of the third switching element and outputs an output signal; and
a differential amplification circuit that amplifies a differential signal between the output signal of the second variable gain amplification circuit and a predetermined reference voltage and supplies a control signal that controls gains of the first variable gain amplification circuit and the second variable gain amplification circuit to the first variable gain amplification circuit and the second variable gain amplification circuit.

11. The current detection circuit according to claim 1, comprising:

a comparison circuit that compares an output signal of the division circuit with a predetermined setting voltage.

12. The current detection circuit according to claim 11, wherein the predetermined setting voltage is set by a value of an on-resistance of the second switching element and a value of a maximum current that is allowable as an output current of the second switching element.

13. The current detection circuit according to claim 1, wherein a gate width of the second switching element is set at N times as much as a gate width of the third switching element (where N is any positive number that is greater than 1).

14. The current detection circuit according to claim 13, wherein a current value of the constant current source is set at 1/N times as much as the value of the maximum current that is allowable as the output current of the second switching element.

15. The current detection circuit according to claim 1, wherein the gate of the second switching element is connected to the gate of the third switching element.

16. The current detection circuit according to claim 1, wherein the gate of the first switching element is connected to the source of the second switching element.

17. The current detection circuit according to claim 1, wherein a first driving signal is supplied to the gate of the first switching element, and
a second driving signal is supplied to the gate of the second switching element.

18. The current detection circuit according to claim 17, wherein a voltage of the first driving signal is switched between a positive voltage and a negative voltage that is less than a threshold voltage of the first switching element.

19. A current detection circuit, comprising:

a normally-on-type first switching element that has a source, a drain, and a gate;
a normally-off-type second switching element that has a drain that is connected to the source of the first switching element, a source, and a gate that is connected to a signal input terminal where a driving signal is applied thereto;
a normally-off-type third switching element that has a source that is connected to the source of the second switching element, a drain that is connected to a constant current source, and a gate that is connected to the gate of the second switching element; and
a division circuit including a first terminal connected to the drain of the second switching element and a second terminal connected to the drain of the third switching element, the division circuit being configured to output an output signal determined by a ratio between a drain voltage of the second switching element supplied to the first terminal and a drain voltage of the third switching element supplied to the second terminal.

20. A current detection circuit, comprising:

a normally-on-type first switching element that has a source, a drain, and a gate;
a normally-off-type second switching element that has a source, a drain, and a gate and has a main current path that is connected to a main current path of the first switching element in series;
a normally-off-type third switching element that has a source that is connected to the source of the second switching element, a gate, and a drain that is connected to a constant current source, where a voltage that is applied to the gate of the second switching element at a time of current detection is applied to the gate of the third switching element;
a first multiplication circuit that multiplies a drain voltage of the second switching element by a predetermined factor to output an output voltage;
a second multiplication circuit that multiplies a drain voltage of the third switching element by the predetermined factor;
a subtraction circuit that outputs a differential signal between an output of the second multiplication circuit and a predetermined reference voltage; and
an amplification circuit that amplifies the differential signal of the subtraction circuit and supplies the predetermined factor to the first multiplication circuit and the second multiplication circuit.

* * * * *